United States Patent [19]

Mezhinsky

[11] Patent Number: 4,802,816
[45] Date of Patent: Feb. 7, 1989

[54] PICK AND PLACE MACHINE HAVING IMPROVED CENTERING JAWS

[75] Inventor: Victor B. Mezhinsky, Anaheim, Calif.

[73] Assignee: Excellon Industries, Torrance, Calif.

[21] Appl. No.: 785,601

[22] Filed: Oct. 8, 1985

[51] Int. Cl.[4] .................. B65G 47/91; H05K 13/02
[52] U.S. Cl. ........................ 414/736; 294/2; 294/119.1; 414/737; 414/786; 901/36; 901/39
[58] Field of Search ........... 414/730, 736, 737, 744 B, 414/752, 786; 294/2, 119.1, 64.1; 901/39, 40, 31, 36

[56] References Cited

U.S. PATENT DOCUMENTS

| | | | |
|---|---|---|---|
| 3,199,910 | 8/1965 | Bradley | 294/88 |
| 3,906,325 | 9/1975 | Salmon | 318/569 |
| 4,001,556 | 1/1977 | Folchi et al. | 235/151 |
| 4,135,630 | 1/1979 | Snyder et al. | 414/627 |
| 4,174,847 | 11/1979 | Wiesler | 279/1 L |
| 4,192,521 | 3/1980 | Smith | 279/112 |
| 4,258,928 | 3/1981 | Wiesler | 279/1 L |
| 4,327,482 | 5/1982 | Araki et al. | 29/740 |
| 4,346,514 | 8/1982 | Makizawa et al. | 29/740 |
| 4,372,802 | 2/1983 | Harigane et al. | 156/538 |
| 4,381,601 | 5/1983 | Tamai et al. | 29/740 |
| 4,428,710 | 1/1984 | Grisebach et al. | 414/590 |
| 4,429,887 | 2/1984 | Smith | 279/112 |
| 4,473,247 | 9/1984 | Itemadani et al. | 414/752 X |
| 4,479,673 | 10/1984 | Inaba et al. | 294/88 |
| 4,515,507 | 5/1985 | Asai et al. | 294/2 X |
| 4,611,846 | 9/1986 | Feiber et al. | 414/737 X |

FOREIGN PATENT DOCUMENTS 1131580 12/1984 U.S.S.R. .

Primary Examiner—Leslie J. Paperner
Attorney, Agent, or Firm—Knobbe, Martens, Olson & Bear

[57] ABSTRACT

A pick and place machine has two pairs of centering jaws slidably mounted in rectilinear slots of a shift plate, with each jaw pair being driven by a pair of scissor links respectively pivoted to a pair of nuts mounted on a dual reverse threaded shaft.

16 Claims, 3 Drawing Sheets

PICK AND PLACE MACHINE HAVING IMPROVED CENTERING JAWS

FIELD OF THE INVENTION

The present invention relates to the field of pick and place machines having a head which is mounted for controlled movement in an X, Y plane and for reciprocal movement in a direction perpendicular to the X, Y plane, with the head having means for detachably attaching a component part to the head at a first location for detachment at a second location. More specifically, the present invention relates to a pick and place machine head having centering jaws for centering the component part on the head after attachment at the first location and prior to detachment at the second location in order to properly align the component part.

BACKGROUND AND SUMMARY OF THE INVENTION

Pick and place machines are known in the art, examples of which are shown in the patents to Tamai et al, U.S. Pat. No. 4,381,601, Araki et al, U.S. Pat. No. 4,327,482, and Snyder et al, U.S. Pat. No. 4,135,630, the disclosures of which are hereby incorporated by reference. Such machines are designed generally to detachably attach an electronic component to a pick and place head at a first location, a supply station, carry the electronic component to a precisely defined second location, a work location, and place the electronic component onto a precisely defined position on a workpiece at the second location. Typically, these pick and place machines employ a vacuum head which attaches the electronic component to the pick and place head as the result of a vacuum suction, which is released when the pick and place head is moved to the second location. In addition, the pick and place heads are typically mounted for reciprocal motion in a direction perpendicular to the X, Y positioning plane, in order to both move the head downwardly at the first location, to attach the electronic component to the head, and to move the head downwardly at the second location, to place the component part adjacent the workpiece, and then press the component part downward onto the workpiece. The electronic components are typically computer chips and like circuit board components, with the workpiece typically being a circuit board, and the function of the head pressing the component down onto the workpiece must be done with the leads of the electronic component, if any, aligned with mating holes in the printed circuit board. Even if there are no leads, typically, components must be placed to be oriented in a specific way on the circuit boards.

It is thus crucial that the pick and place machine not only be properly controlled to select a proper part from a proper location and transport that part to the proper second location, but also that the part be correctly aligned on the pick and place machine head, such that at the second location, e.g., the electrical leads of the part will be properly aligned with the associated mating holes in the printed circuit board.

The above mentioned patents show centering jaws for accomplishing this general purpose. However, each of the centering jaw arrangements shown in the above noted patents involve centering jaws which require a large amount of vertical space and are formed on the foot of a pivoted member which is pivoted about a point axially displaced from the pivoting jaws in a direction aligned with the axis of reciprocal motion of the pick and place head, and with the pivot axis aligned with the X, Y plane. Thus, for example, in the patent to Tamai et al (referred to above) in FIGS. 5a, b and c, the jaws 33 are shown to pivot about pivot pins 32 through a lever action on rollers 40 created by a cam 41, with the pivot pins 32 displaced above the pick and place head 2 and the rollers displaced further above the pivot pins 32. In like manner, FIGS. 10, 11, 13 and 14 of the patent to Araki et al (referred to above) show the jaws 25, 25' and 24, 24' pivoted about pivot points 22, 22' and 23, 23' displaced above the pick and place head 2 and brought into engagement by the action of springs 26, 27 disposed intermediate the pivot points and the jaws and also axially above the jaws in the direction perpendicular to the X, Y plane. Similarly also, the patent to Synder et al (referred to above) in, for example, FIGS. 7, 8 and 11 shows the jaws 326 pivoting about knife blade pivots 301 contained in grooves 300 disposed above the pick and place head 2, with the axis of pivoting parallel to the X, Y plane.

Such arrangements of the aligning jaws create several problems. First, because the jaws in such an arrangement swing in an arc and not parallel to the X, Y plane, the flat surfaces of the jaws which engage the part to align the part on the pick and place head are vertically oriented only for a particular component part size equal to the distance between the engaging flat surfaces of the jaws when those flat surfaces are in alignment with the axial direction of the reciprocal motion of the pick and place head. If the component part is either too large or too small, when the jaws engage the component part, the flat surfaces of the jaws will be out of alignment with the axial direction of reciprocal motion of the pick and place head. This may cause the component part to be canted or twisted out of alignment with a plane parallel to the X, Y plane.

This creates two problems at the point of attachment of the electronic component part to the pick and place head. First, the component may be damaged due to stresses placed on the component because the direction of force applied to the component is not aligned with the plane of the component. Second, the component may be twisted sufficiently from the plane perpendicular to the axial direction of reciprocal motion of the pick and place head sufficiently to break the vacuum which holds the component to the pick and place head. This may cause the component to become further unaligned from the direction of force application by the flat engaging surfaces of the alignment jaws, particularly in the case of force application by spring means, as shown in the patent to Araki et al. However, even where the force application is regulated, the misalignment of the component part may cause the application of a regulated torque to be sufficient to damage the component due to its misorientation.

A further problem results when the canted or twisted component part misaligned with the direction of the plane perpendicular to the axial direction of reciprocal motion of the pick and place head is attempted to be placed upon a workpiece at a second location by the pick and place machine. As mentioned above, the electrical components typically have electrical leads which must be placed in corresponding holes in, for example, a circuit board. If the component part is misaligned with the plane perpendicular to the axial direction of reciprocal motion of the pick and place head, the leads very likely will not properly mate with the corresponding holes on the circuit board. Thus, when the pick and place head presses the component down to the circuit board, the electrical leads most likely will not all fit into their associated holes in the circuit board, and, further, the leads may be bent or even broken as a result of the application of the pushing force in the direction of the reciprocal motion of the pick and place head during the placing operation.

The above-noted problems with the prior art are not intended to be exhaustive, but rather are give as examples of the disadvantages of presently existing alignment jaws employed with pick and place machines.

Recognizing the need for an improved alignment jaw arrangement for a pick and place machine head, it is a general feature of the present invention to provide an improved alignment jaw arrangement for a pick and place head that is more compact vertically.

Another feature of the present invention is the provision of a linkage means associated with each jaw member of a respective pair of jaw members pivotally connected to a pivot point having a pivoting axis generally perpendicular to the head plate.

Yet still another feature of the present invention is the provision of jaw operating means for simultaneously pivoting the linkage means for each jaw of a respective pair of jaws about the respective linkage means pivotal connection.

A further feature of the present invention is to provide the jaw members of the first pair of jaws with a relatively broader component part engaging surface and the jaw members of the second pair with a relatively narrower component part engaging surface.

Still a further feature of the present invention comprises the jaw operating means including first and second internally threaded nuts pivotally connected to a respective one of the linkage means for a respective pair of jaw members and a threaded shaft threadedly engaging the first and second internally threaded nuts, with the shaft and nuts threaded such that rotation of the shaft in one direction moves the threaded nuts towards each other and rotation of the shaft in the other direction moves the nuts away from each other.

Still another further feature of the present invention involves the combination in a pick and place machine of a head body, means for mounting the head body for motion between a first postion from which a part is to be taken and a second position to which a part is to be transferred, a chuck mounted to the head body for reciprocating motion in a first direction toward and away from the device carrying the part to be taken at the first position and a workpiece at the second position, with the chuck having a tip including means for detachably securing a part to the tip and means for shifting the component part secured to the tip comprising a shaft plate with an aperture for receiving the chuck and disposed in a plane substantially perpendicular to the first direction and having first and second pairs of opposed centering jaws slidably mounted to the shift plate for motion substantially parallel to the plane of the shift plate toward and away from the aperture.

Yet still another further feature of the present invention is the provision of a lost motion pivotal connection between the respective linkage for each respective jaw of each of the pair of jaws, with the lost motion pivotal linkage comprising a lost motion slot generally aligned with the longitudinal axis of the respective linkage in the vicinity adjacent the jaw.

Still another and yet further feature of the present invention is the pivotal connection of the linkages for each jaw of a respective pair of jaws at an end of the linkages remote from the end connected to the respective jaw.

The above noted features and advantages of the present invention are not intended to be exhaustive, but rather are illustrative of the features and advantages of the present invention and are offered in order that those skilled in the art may better understand the present invention and the contribution to the art. These and other advantages and features of the present invention will be better understood by reference to the Detailed Description of a Preferred Embodiment referred to below in connection with the drawings, in the figures of which like reference numerals have been used to identify like elements.

DETAILED DESCRIPTION OF A PREFERRED EMBODIMENT

Figure 1:
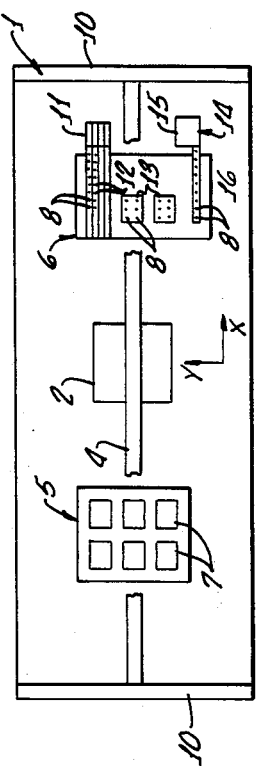
FIG. 1 shows schematically a pick and place machine which may, e.g., be of the kind manufactured by the assignee of the present application, Excellon Industries, under the name MC-30, an improvement of which is the utilization of the pick and place head having a centering jaw mechanism according to the present invention.
Figure 2:
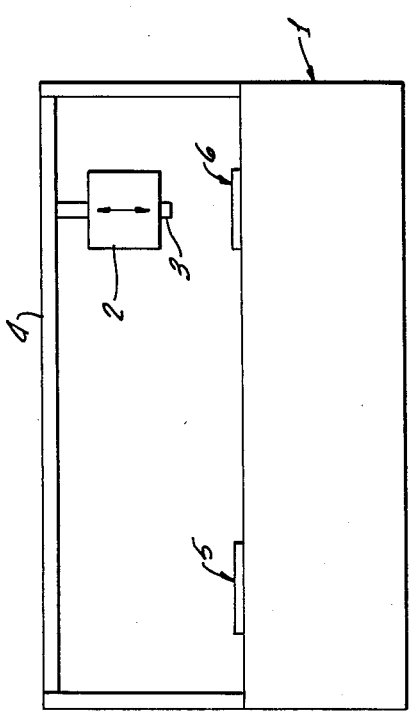
FIG. 2 shows schematically a plan view of the pick and place machine according to FIG. 1.

Turning now to FIGS. 1 and 2, there is shown in schematic fashion a pick and place machine 1 according to the present invention. The pick and place machine has a head 2 having a chuck 3, mounted for reciprocal motion, either with the head 2 or within the head 2, or in combination with the head 2 and within the head 2. The head 2 is mounted on a gantry 4 which moves on tracks 10, and which has a means (not shown) for moving the gantry in the X and Y directions, with the X and Y directions being defined as the directions defining a plane perpendicular to the axis of the motion of the chuck 3. The pick and place machine has a work station 5 and a supply station 6. In operation, the gantry 4 moves the pick and place machine head 2 to a position above the supply station 6. The head 2, or the chuck 3, or the head 2 and chuck 3, are displaced downwardly towards the supply station, whereby the chuck 3 comes in contact with a component part 8 positioned at a selected location at the supply station 6. The chuck 3 then attaches the component part to itself, for example, by a vacuum suction provided by a hollow interior (not shown) of the chuck 3 which is connected to a vacuum pump (not shown) through vacuum lines (not shown). It will be understood that there are other means for attaching the component part to the chuck 3 at the supply station.

The head 2, or the chuck 3, or the head 2 and the chuck 3, are then moved vertically away from the supply station 6, and the gantry 4 moves the head to a position above the work station 5. At the work station 5 there is positioned a workpiece, e.g., a printed circuit board 7, upon which the component part is to be deposited at a selected location. The pick and place machine 1 has a means (not shown) for specifically positioning the head 2 in an X, Y coordinate system above the workpiece to align the chuck 3 with the particular location on the workpiece 7. The head 2, or the chuck 3, or the head 2 and the chuck 3, are then displaced downwardly toward the workpiece 7 at the work station 5, and the chuck 3 presses the component part 8 into the desired position on the workpiece 7.

It will be understood by those skilled in the art that the pick and place machine 1 may be operated under the control of a microprocessor, or other suitable programmed controller, or under firmware controllers, e.g., large scale integrated circuits dedicated to performing certain control functions based upon stored data and logic functions. The specifics of the control circuitry, except as explained below, are not part of the present invention.

One function of the control circuitry is to drive the head 2 on the gantry 4 and tracks 10 to locate it above a selected supply station 6 location to pick a selected electronic component or the like. Components may be delivered to selected locations at the supply station 6 by various means known in the art, e.g., tape reels 11, which disgorge across the supply station a tape 12, each perhaps containing a different kind of component; trays 13 which may contain on one tray the same or different kinds of components; or vibrating slot dispensers, e.g., slot dispenser 14 having a component supply bay and one or more vibrating slots 16.

The controller stores in memory where at the supply station the chuck 3 must be positioned to pick a desired component part 8 and where on the workpiece 7 at the work station that component is to be placed.

The controller may be programmed, or otherwise adapted, to control other functions, e.g., the motion of the chuck 3 in a Z direction generally perpendicular to the X, Y plane. The controller can also provide output signals to the motor controllers (58 and 60 shown in FIGS. 3 and 4) for the present invention, as will be explained. However, other than the fact such controller must be capable of providing signals as explained below it forms no part of the present invention. An example of suitable control circuitry for X, Y plane movement of the head 2 is shown in the Excellon Industries (of Torrance Calif.) MC-30 machine presently on the market.

Many of the above-described features of a pick and place machine are known in the art and are explained herein, and illustrated schematically in FIGS. 1 and 2, simply as a definition of the environment in which the pick and place machine head, having the centering jaw mechanism according to the present invention, is designed to operate. Machines which perform above-noted functions may be seen, for example, in the patents referenced above and in the pick and place machine manufactured by Excellon Industries under the name MC-30. It will also be noted that pick and place machines may have certain other variations in order to obtain or enhance the relative X, Y motion between the pick and place head and the workpiece, e.g., the workpiece itself may be controllably movable beneath the chuck 3 at the work station 5. This is shown, e.g., in the MC-30 referenced above.

Figure 4:
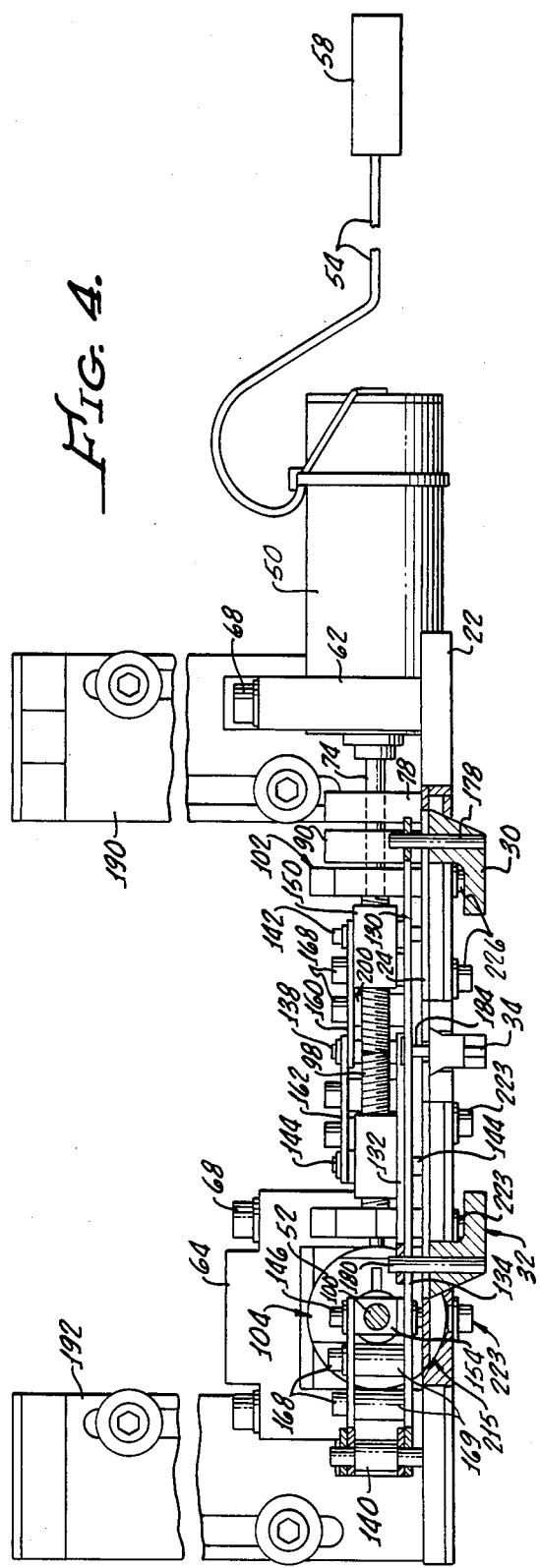
FIG. 4 is a side elevational view of the apparatus as shown in FIG. 3.
Figure 3:
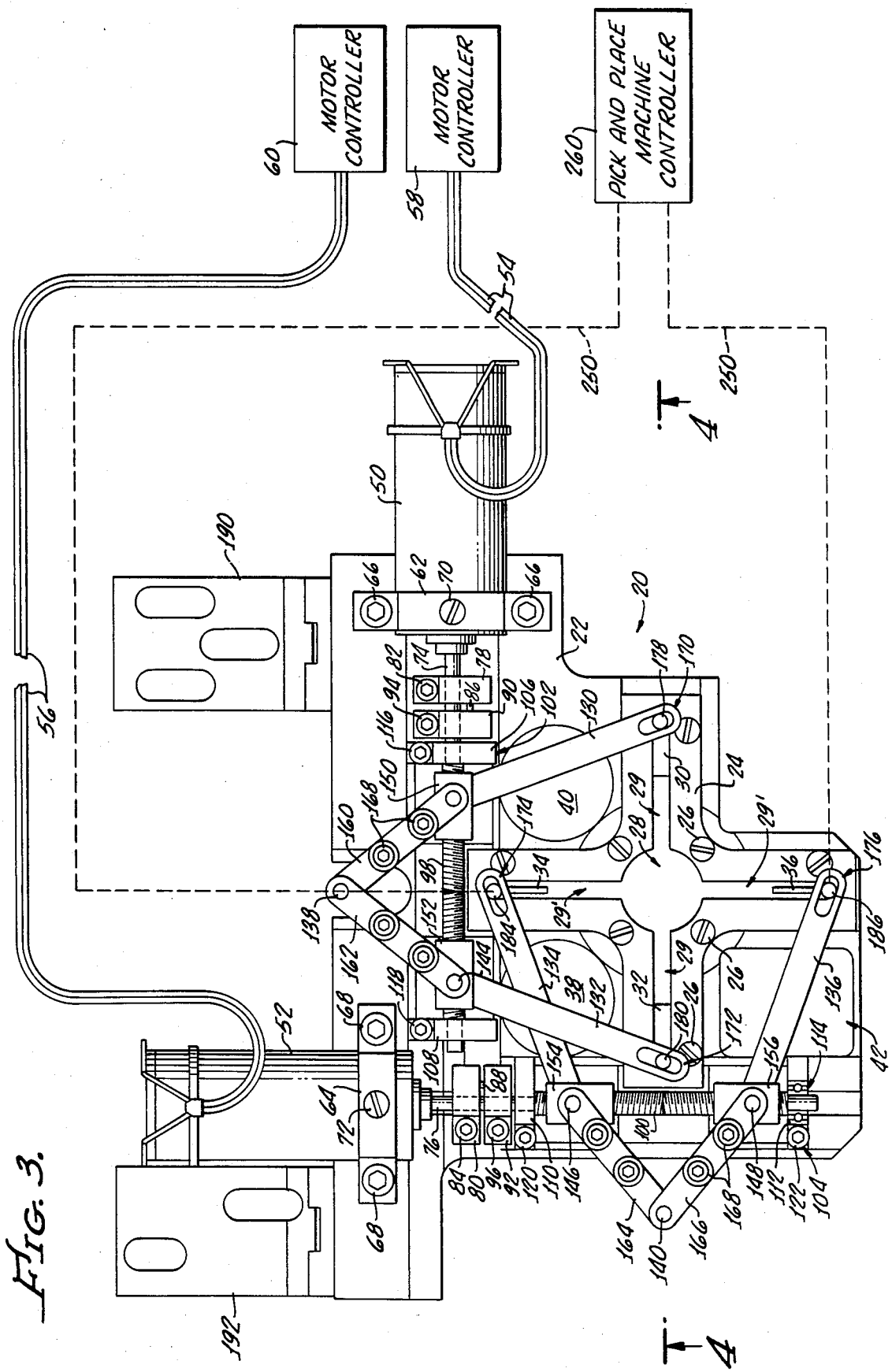
FIG. 3 is a top plan view of the pick and place head plate on which is mounted the centering jaw mechanism according to the present invention containing the component part alignment jaws and associated operating mechanisms.

Turning now to FIGS. 3 and 4, the chuck head 20, according to the present invention, is shown, respectively, in a plan top view and a side view, with the top view looking downward on the chuck head on a side opposite the side facing the work station and supply station during operation.

The chuck head includes a chuck head plate or shift plate 22 which gives structural support to the component parts of the chuck head 20, having a centering jaw mechanism as described below. A jaw retaining plate 24, generally in the shape of a cross, is attached to the chuck head plate 22 by a plurality of screws 26. The jaw retaining plate 24 has a chuck receiving bore 28. The chuck head plate 22 similarly has a hole aligned with the chuck head bore 28 of the jaw retaining plate 24. The jaw retaining plate 24 covers two pairs of aligned slots 29, 29' in the head plate 22, each having longitudinal axes that intersect at generally the center line of the chuck receiving bore 28. Slidably mounted within each of the oppositely disposed aligned slots 29 and 29' is one of the pair of two pairs of jaw members 30, 32 and 34, 36. The jaw members 30 and 32 are broad jaw members, as will be described below, and the jaw members 34 and 36 are narrow jaw members, as will be described below. The jaw retaining plate 24 forms with the head plate 22 a slot receiving the jaw members 30, 32 and 34, 36, leaving a slotted opening above the slots 29, 29'.

The chuck head plate 22 has a pair of circular cutouts 38 and 40 and a rectangular cutout 42, which are for the purpose of decreasing the overall weight of the chuck head 22. In addition, one corner of the chuck head plate 22 is removed to further decrease the weight of the chuck head 20.

Mounted to the chuck head plate 22 are a pair of motors 50, 52 which are respectively connected by electrical leads 54, 56 to a pair of controllers schematically illustrated as blocks 58 and 60 in FIG. 3. The motor 50 is connected to the chuck head plate 22 by a motor bracket 62, and the motor 52 is connected to the chuck head plate 22 by a motor bracket 64. The motor bracket 62 is bolted to the chuck head plate 22 by a pair of screws 66, and the motor bracket 64 is bolted to the chuck head plate 22 by a pair of screws 68. A screw 70 and a screw 72 tighten motor bracket 62 and the motor bracket 64, respectively, to retain the motor 50 and the motor 52 in its motor bracket 62, 64, respectively, on the chuck head plate 22. The motor 50 has a shaft 74 which has attached to it a motor coupling collar 78, and the motor 52 has a shaft 76 which has attached to it a motor coupling collar 80. The motor coupling collar 78 is a split collar and is tightened about the shaft 74 by a tightening screw 82. Similarly, the motor collar 80 is tightened about the shaft 76 by a tightening screw 84. A pin 86 connects the motor coupling collar 78 to a shaft coupling collar 90, which is also a split collar, and is connected to a dual reverse threaded shaft 98 by tightening a tightening screw 94. Similarly, the motor coupling collar 84 is connected by a pin 88 to a shaft coupling collar 92, which is connected to a dual reverse threaded shaft 100 by tightening a tightening screw 96.

The dual reverse threaded shaft 98 is rotatably mounted in a cradle bearing 102, and the dual reverse threaded shaft 100 is rotatably mounted in a cradle bearing 110. The cradle bearing 102 (FIG. 5) has two upstanding portions 106 and 108 which form split collars containing a bearing, e.g., a ball bearing (shown in FIG. 6), with the respective split collars of the upstanding portions 106 and 108 being tightened about the respective bearing by tightening screws 116 and 118 to provide a rigid support for the threaded shaft. Similarly, the cradle bearing 104 has a pair of upstanding portions 110 and 112 each forming a split collar housing a ball bearing, e.g., ball bearing 114 shown in the upstanding portion 112, and each being tightened about the ball bearing, e.g., ball bearing 114, by tightening screws 120 and 122, respectively.

A first pair of bent linkage arms 130, 132, lying generally in the plane at the chuck head plate 22, are pivotally connected at one end thereof by a pivot pin 138. A second pair of linkage arms 134, 136, also lying in plane generally parallel to the chuck head plate 22, are pivotally connected at one end thereof by a pivot pin 140. The arm 130 is pivotally connected intermediate its ends at the bend in the arm by a pivot pin 142 to an internally threaded slide member 150. Similarly, the other arms 132, 134 and 136 are pivotally connected by pivot pins 144, 146 and 148, respectively, to internally threaded slide members 152, 154 and 156, respectively. The actual connection of the arms 130, 132, 134 and 136 to the slide members 150, 152, 154 and 156, respectively, is by an extension of the pin members 142, 144, 146 and 148, respectively, on the opposite side of the slide member 150, 152, 154, and 156, respectively (not shown in FIG. 3, but seen in FIG. 4 for the pin members 142, 144, and 146). It will be understood that the pin members 142, 144, 146 and 148 do not extend through the respective slide members (nuts) 150, 152, 154 and 156, due to the internally threaded portion of the slide members 150, 152, 154 and 156 receiving the threaded shafts 98 or 100. Rather, the pin members 142, 144, 146 and 148 extend on opposite sides of the slide members 150, 152, 154 and 156.

A brace bar 160 extends between the pivot pin 138 and the portion of the pin member 142 shown in FIG. 3, and is pivotally attached to each of these overlying the part of arm 130 between pins 142 and 138. Similarly, associated with the arms 132, 134, and 136 are brace members 162, 164, and 166. The brace members 160, 162, 164, and 166 are connected with the underlying portion of the arms 130, 132, 134, and 136 (not seen in FIG. 3) by pins 168, which pass through hollow cylindrical separators 169 (shown in FIG. 4). These brace bars provide vertical stability and registry for the pairs of pivoted links 130, 132 and 134, 136, and also help such links to restrain pivoting of the slide members 150, 152, 154, 156 about the axes of shafts 95, 100.

At the end of the arm 130 disposed away from the pivotal connection 138 is a lost motion connection consisting of a closed end slot 170 formed in the end of the arm 130. Similarly, the arms 132, 134 and 136 have lost motion slots 172, 174 and 176, respectively. Slidably engaged within the slot 170 is a pin 178 extending from the jaw member 30. Similarly, extending from the jaw members 32, 34, 36 are pins 180, 184, 186 which slidably engage the respective lost motion slot 172, 174, 176. The pins 178, 180, 184 and 186 are held in place by lock washers.

The chuck head plate 22 is connected to a pair of mounted brackets 190 and 192 for connection to the head 2 of the pick and place machine for movement along with the head 2 on the gantry 4. The head 2 is aligned with the chuck head plate 22 such that the chuck 3 passes through the chuck receiving bore 28 in its reciprocal motion, or, in the case of a pick and place machine in which the reciprocal motion of the chuck is due to motion of the head 2 alone, the chuck 3 is aligned with the chuck receiving bore 28, but does not reciprocally move within the bore 28.

Figure 5:
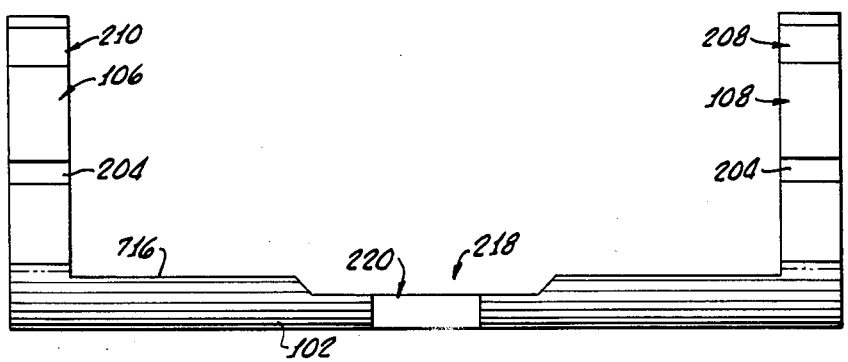
FIG. 5 is a side elevational view of a cradle bearing employed with the operating mechanism shown in FIGS. 3 and 4.
Figures 6, 7:
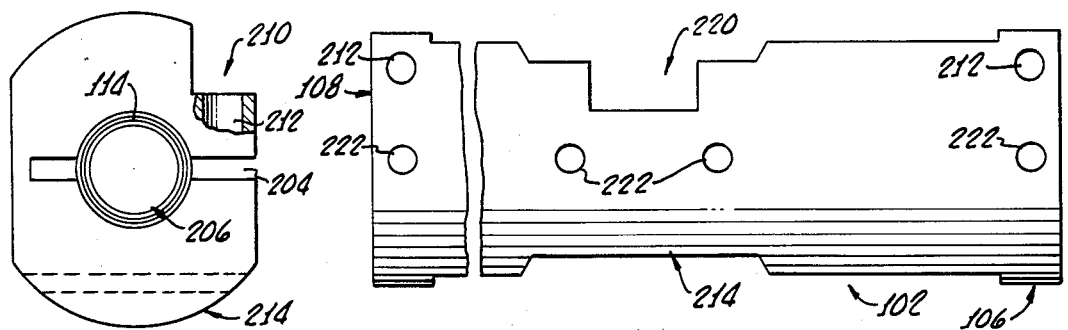
FIG. 6 is a partially broken away bottom view of the cradle bearing shown in FIG. 5.
FIG. 7 is an end view of the cradle bearing shown in FIG. 5.

One of the cradle bearings 102 is shown in more detail in FIGS. 5, 6 and 7. It will be seen that the upstanding members 106 and 108 form split collars having slots 202 and 204, respectively, which open to form a bearing receiving bore 206, within which is contained a bearing, e.g., ball bearing 114. The upper and lower surfaces of the upstanding portions 106 and 108 are curved, as shown in FIG. 6, with the bottom surface 214 resting in a trough formed by the groove 215 having slanted walls as shown in FIG. 4. A portion of the upper half of the upstanding members 106 and 108 has a cutaway portion 210 (shown in FIG. 6) to allow for the positioning of the tightening nut, e.g., 116. The tightening nut passes through a threaded bore 212. The split collars and tightening nuts permit the threaded shaft to be longitudinally shifted relative to the cradle bearings to permit precise centering of the jaw members.

The partially cut away and truncated bottom view of FIG. 7 shows a plurality of internally threaded bores 222 which receive nuts 223, as shown, for example, in FIG. 4, to attach the cradle bearing 102, 104 within the slanted groove 215, as shown in FIG. 4. A rectangular shaped slot 220 (shown in FIG. 7) is cut into the cradle bearings 102 and 104 to accommodate retaining plate 24.

Figures 8, 9:
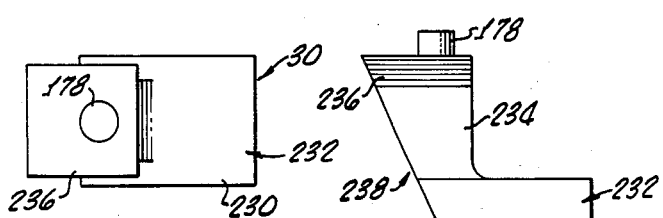
FIG. 8 is a top view of a broad faced centering jaw according to the present invention.
FIG. 9 is a side view of the broad face centering jaw shown in FIG. 8.
Figure 10:
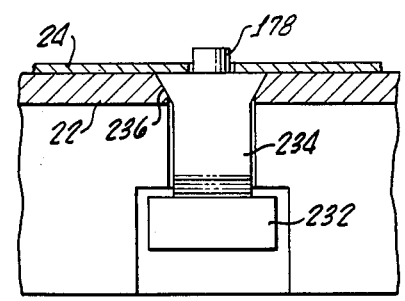
FIG. 10 is a front view of the centering jaw shown in FIGS. 8 and 9 contained within a guide slot in the centering head plate according to the present invention.

Turning now to FIGS. 8, 9 and 10 there is shown a top view, side view and front view of one of the pair of broad faced jaws, e.g., 30. The broad faced jaw 30 has a jaw body 230 which has a relatively broad engaging surface 232. Upstanding from the jaw body 230 is an upstanding member 234 to which is attached a guide member 236. The guide member 236, as shown in FIG. 10, is beveled outwardly to fit within the guide slot 29, in the head plate 22 for the particular jaw which is formed with slanted sidewalls, as shown in FIG. 10. The back portion of the jaw member forms a slanted surface 238, as shown in FIG. 9. The broad face 232 of the jaw member 30 has a width of approximately two tenths of an inch and a height of approximately eighty-five one thousandths of an inch.

Figures 11, 12:
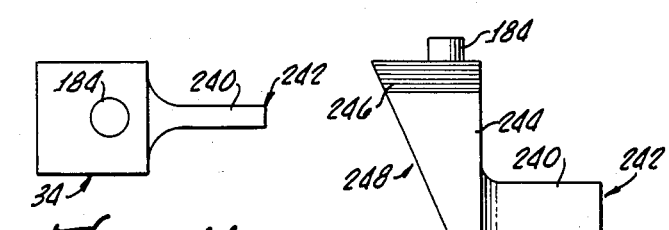
FIG. 11 is a top view of a narrow faced centering jaw according to the present invention.
FIG. 12 is a side view of the centering jaw of FIG. 11.
Figure 13:
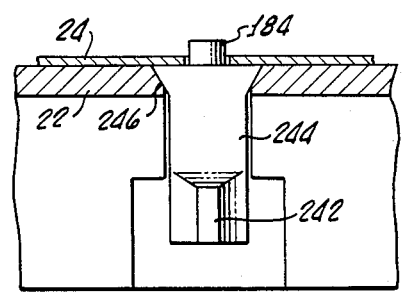
FIG. 13 is a front view of the centering jaw of FIGS. 11 and 12 contained within a guide slot in the head plate according to the present invention.

Turning now to FIGS. 11, 12 and 13, there is shown a top view, side view and front view of one of the pair of narrow faced jaw members, e.g., 34. The jaw member 34 has a jaw body 240 which narrows down into an elongated portion terminated at a narrow engaging surface 242. Upstanding from the jaw body 240 is an upstanding member 244 which connects the jaw body 240 to a guide member 246. The guide member 246, as shown in FIG. 13, is beveled outwardly fit within a slot 29' in the head plate 22, which has slanted sidewalls as shown in FIG. 13. The back surface of the jaw member forms a slanted surface 248, as shown in FIG. 12. The width of the jaw member engaging surface 242 is approximately thirty-one one thousandths of an inch and the height is approximately eighty-five one thousandths of an inch.

During operation of the pick and place machine 1 according to the present invention, the head 2 of the pick and place machine 1 is moved to a position above, for example, the supply station 6, and movement of either the head 2, or the chuck 3, or the head 2 together with the chuck 3, in a direction perpendicular to the chuck head plate 22 at a specifically selected location is caused, whereby the chuck 3 is brought in contact with a selected electronic component. The means for attaching the electronic component to the chuck 3, for example, vacuum suction within the chuck 3, causes the electronic component to become attached to the chuck 3. However, the precise alignment of the electronic component on the chuck 3 is not known, except in certain prior art in which the electronic components are precisely oriented upon the work station. This causes increased costs in precisely aligning the electronic components at the particular locations in the work station.

Therefore, the apparatus and method according to the present invention provides for centering jaws 30, 32, 34, and 36 which are brought into contact with the side edges of the electronic component through the operation of the motors 50 and 52. Energizing the motors 50 and 52 turns the respective shafts 98 and 100. The respective shafts 98 and 100 are oppositely threaded from their midpoint outward toward the ends of the shaft 98, 100. Thus, rotation of the shaft 98, 100 in one direction moves the internally threaded sleeves, respectively 150, 152 and 154, 156, towards each other. The arms 130 and 132, pivoting about pivot pin 138, drive the jaw members 30, 34 toward the center line axis of the chuck receiving bore 28, and the arms 134, 136, pivoting about pivot point 140, drive the jaw members 34 and 36 toward the center line axis of the chuck receiving bore 28. Because the length of the angulated links, such as link 130 between the driven jaw 30 and the driving sleeve 150, is so much greater than the length of such link between the link pivot 138 and sleeve 150, the several sleeves travel shorter distances than the jaws, decreasing wear on the sleeves and threaded shafts and enabling more compact packaging of the shafts and oppositely disposed driving sleeves.

The motor controllers 58, 60, shown schematically as blocks in FIG. 3, may receive independent signals from the main pick and place machine controller 260, shown in FIG. 3, to move the respective jaws 30, 32 and 34, 36 at different speeds or different distances. For example, it is preferable to have the wider faced jaws 30, 32 contact the electronic component 8 before the narrower faced jaws 34, 36. Thus, e.g., for a square component, the pick and place machine controller 260 would have stored data that the component 8 next to be picked and the next supply station 6 supply location, e.g., 12, 13, 16, is square.

Other means exist to control the engagement of the jaws 30, 32 and 34, 36, as will be understood by those skilled in the art.

The pick and place machine controller 260 can also be set up to provide connection between the electrically conductive narrow jaws 34, 36 through electrical leads 250, shown in phantom in FIG. 3, to a testing circuit 262 to electrically test an electrical characteristic of the component 8.

The foregoing detailed description is to be clearly understood as given by way of illustration and example only, the spirit and scope of this invention being limited solely by the appended claims.

What is claimed is:

1. A pick and place machine for moving a part having a top surface and side faces, said machine comprising:
   a head body;
   means for mounting the head body to provide motion between a first position from which the part is to be taken and a second position to which the part is to be transferred;
   a chuck mounted to the head body that provides reciprocating motion in a first direction toward and away from the part to be taken, the chuck having a tip that provides a vacuum for detachably supporting the part and securing the part to said tip; and
   means for shifting the part secured to the tip, comprising:
   a shift plate mounted to the head body, the shift plate extending in a first plane substantially perpendicular to the first direction and having an aperture for receiving the chuck during the reciprocating motion thereof;
   first and second pairs of opposed centering jaws slideably mounted to the shift plate for linear motion substantially parallel to the plane of the shift plate, toward and away from the aperture, between an open position and a closed position, the jaws of the first pair being movable toward and away from each other at opposite sides of the aperture along a first line, the jaws of the second pair being movable toward and away from each other along a second line intersecting said first line, each of said jaws positioned to contact only the side faces of said part; and
   jaw operating means for moving the jaws along said lines, said jaw operating means comprising first and second linkage means lying substantially in a second plane parallel to the first plane and respectively connected to jaws of the first and second pairs of opposed centering jaws.

2. The pick and place machine of claim 1 wherein the linkage means comprise first and second links connected respectively to the jaws of the first pair, third and fourth links connected respectively to the jaws of the second pair, first driving means for driving the first and second links, and second driving means for driving the third and fourth links.

3. The pick and place machine of claim 1 including first and second motors for respectively independently actuating the first and second linkage means.

4. The pick and place machine of claim 1 wherein the jaws of the first pair are relatively wide in a direction normal to the first line and the jaws of the second pair are relatively narrow in a direction normal to the second line, the jaw operating means including disproportionate driving means for moving the jaws of the first pair toward the aperture to grasp a part secured to the chuck tip ahead of the jaws of the second pair reaching a position to grasp the part, whereby a part secured to the chuck tip will be oriented by the wider jaws of the first pair before it is grasped by the narrower jaws of the second pair.

5. A pick and place machine comprising:
   a head body;

means mounting the head body for motion between a first position from which a part is to be taken and a second position to which the part is to be transferred;

a chuck mounted to the head for reciprocating motion in a first direction toward and away from a device carrying the part to be taken, the chuck having a tip including means for detachably securing a part to said tip; and means for shifting a part secured to the tip, comprising:

a shift plate mounted to the head body, the shift plate extending in a plane substantially perpendicular to the first direction and having an aperture for receiving the chuck during the reciprocating motion thereof;

first and second pairs of opposed centering jaws slideably mounted to the shift plate for motion substantially parallel to the plane of the shift plate toward and away from the aperture, the jaws of the first pair being movable toward and away from each other at opposite sides of the aperture along a first line, the jaws of the second pair being movable toward and away from each other along a second line that is angulated relative to the first line; and jaw operating means for moving the jaws along said lines, said jaw operating means comprising first and second linkage means lying substantially in a plane parallel to the first-mentioned plane and respectively connected to jaws of the first and second pairs, the first and second linkage means each including:

first and second links pivotally connected to one another at one end of each of the links, the other end of each link being respectively connected to one of the jaws of a respective pair of jaws; and driving means for pivotally driving the links relative to one another about their common pivotal connection.

6. A pick and place machine comprising:

a head body;

means mounting the head body for motion between a first position from which part is to be taken and a second position to which the part is to be transferred;

a chuck mounted to the head for reciprocating motion in a first direction toward and away from a device carrying the part to be taken, the chuck having a tip including means for detachably securing a part to said tip; and means for shifting a part secured to the tip, comprising:

a shift plate mounted to the head body, the shift plate extending in a plane substantially perpendicular to the first direction and having an aperture for receiving the chuck during the reciprocating motion thereof;

first and second pairs of opposed centering jaws slideably mounted to the shift plate for motion substantially parallel to the plane of the shift plate toward and away from the aperture, the jaws of the first pair being movable toward and away from each other at opposite sides of the aperture along a first line, the jaws of the second pair being movable toward and away from each other along a second line that is angulated relative to the first line; and jaw operating means for moving the jaws along said lines, said jaw operating means comprising first and second linkage means lying substantially in a plane parallel to the first-mentioned plane and respectively connected to jaws of the first and second pairs, the linkage means comprising:

a first link having a lost motion pivotal connection to a first jaw of the respective first pair of jaws;

a second link having a lost motion pivotal connection to a second jaw of the respective pair of jaws;

a link pivot pin pivotally interconnecting the links to one another at a point remote from the jaws;

first and second nuts pivotally mounted upon a respective one of the first and second links intermediate the respective lost motion pivotal connection and the respective link pivot pin;

a threaded shaft extending through each of the nuts; and means for rotating the threaded shaft.

7. A pick and place machine comprising:

a head body;

means mounting the head body for motion between a first position from which a part is to be taken and a second position to which the part is to be transferred;

a chuck mounted to the head for reciprocating motion in a first direction toward and away from a device carrying the part to be taken, the chuck having a tip including means for detachably securing a part to said tip; and means for shifting a part secured to the tip, comprising:

a shift plate mounted to the head body, the shift plate extending in a plane substantially perpendicular to the first direction and having an aperture for receiving the chuck during the reciprocating motion thereof;

first and second pairs of opposed centering jaws slideably mounted to the shift plate for motion substantially parallel to the plane of the shift plate toward and away from the aperture, the jaws of the first pair being movable toward and away from each other at opposite sides of the aperture along a first line, the jaws of the second pair being movable toward and away from each other along a second line that is angulated relative to the first line; and jaw operating means for moving the jaws along said lines, said jaw operating means comprising first and second linkage means lying substantially in a plane parallel to the first-mentioned plane and respectively connected to jaws of the first and second pairs, wherein the jaws are mounted for motion along a first side of the plate, and wherein the linkage means is mounted along the opposite side of the plate, the linkage means comprising:

a pair of mutually angulated intersecting first and second links;

first and second plate slots formed in said plate on opposite sides of the aperture and extending along the first line;

first and second link slots formed in a respective one of the first and second links at the free end thereof and extending along a portion of the length of the respective link;

first and second jaw pins attached to a respective jaw and extending through corresponding ones of the plate slots and link slots to pivotally connect the respective one of the first and second jaws with a respective link to form a lost motion connection along the link, whereby each jaw pin will move along its associated plate slot as the one jaw moves toward and away from the other jaw of the respective pair of jaws;

a link pivot pin extending through the end of each of first and second links remote from the end having the link slot;

first and second threaded nuts pivotally connected to intermediate portions of the first and second links respectively;

a shaft having first and second oppositely threaded portions extending in threaded engagement with respective ones of the threaded nuts; and a motor connected to rotate the shaft.

8. A pick and place machine comprising
a worktable adapted to support a workpiece at a work station, upon which parts are to be placed,
a supply station on said worktable adapted to contain a supply of parts to be placed upon the workpiece, and
a head mounted for motion between the supply station and the workpiece for transport of parts from the supply station to the workpiece, the head including:
 a head body;
 a chuck mounted to the head body for reciprocation toward and away from a part on the work station and toward and away from the workpiece, the chuck having a tip for detachably securing a part thereto, and
 positioning means for positioning a part relative to the chuck tip after the part has been secured to the chuck tip, the positioning means comprising:
 a shift plate mounted to the head body and having a lower surface facing the supply station and the workpiece, the shift plate extending substantially in a plane parallel to the direction of motion of the head between the supply station and the work station, and having an aperture for receiving the chuck tip,
 first and second pairs of centering jaws mounted to the plate for linear motion on opposite sides of the aperture toward and away from the aperture,
 first and second pairs of links each comprising first and second links pivotally connected to one another at one end of each link, the other end of each link being pivotally and slidably connected to a respective jaw of the respective first and second pairs of jaws,
 driving means for simultaneously pivoting each link of each respective pair of links about the pivotal interconnection between the respective links, to thereby move the jaws toward or away from the aperture.

9. The machine of claim 8 including first and second internally threaded nuts pivotally secured to intermediate portions of the first and second links, the driving means comprising a threaded shaft engaging both of the first and second internally threaded nuts and rotating means for rotating the shaft.

10. A head for a pick and place machine having a chuck mounted for reciprocal motion in a first direction, which chuck has a tip that detachably secures a component part having a plurality of side faces to the tip, comprising:
 a head plate mounted on the head and generally lying in a plane perpendicular to said first direction and having an aperture for receiving the chuck;
 first and second pairs of shifting jaw members mounted to the head plate that provide reciprocally linear motion in a plane generally aligned with the head plate and along first and second lines intersecting generally at the center line of the aperture, each of said jaw members in said pairs of jaw members positioned to contact only the side faces of said component part;
 a linkage arm associated with each jaw member of a respective pair of jaw members, each linkage arm pivotally connected to pivot about a respective pivot axis generally perpendicular to the head plate; and
 means for simultaneously pivoting the linkage arm of each jaw member of a respective pair of jaw members about its respective pivot axis.

11. A head for a pick and place machine having a chuck mounted for reciprocal motion in a first direction, which chuck has a tip for detachably securing a component part to the tip, comprising:
 a head plate mounted on the head and generally lying in a plane perpendicular to the first direction and having an aperture for receiving the chuck;
 first and second pairs of shifting jaw members mounted to the head plate for reciprocal motion in a plane generally aligned with the head plate and along first and second lines intersecting generally at the center line of the aperture;
 linkage means associated with each jaw member of a respective pair of jaw members, pivotally connected for pivoting about an axis generally perpendicular to the head plate; and
 means for simultaneously pivoting the linkage means for each jaw member of a respective pair of jaw members about the respective linkage means pivotal connection, the means for simultaneously pivoting the linkage means including:
 first and second internally threaded nuts pivotally connected to a respective one of the linkage means for a respective pair of jaw members, and wherein the means for simultaneously pivoting the linkage means further comprises a threaded shaft engaging the first and second internally threaded nuts, with the shaft and nuts threaded such that rotation of the shaft in one direction moves the threaded nuts towards each other, and rotation of the shaft in the opposite direction moves the nuts away from each other, along the threaded shaft; and
 rotating means for rotating the threaded shaft.

12. A pick and place machine for moving parts having a plurality of side faces, comprising:
 a head body;
 means mounting the head body for motion between a first position from which a part is to be taken and a second position to which the part is to be transferred;

a chuck mounted to the head body for reciprocating motion in a first direction toward and away from a device carrying the part to be taken, the chuck having a tip that includes means for detachably securing a part to said tip; and means for shifting a part secured to the tip comprising:

a shift plate mounted to the head body, the shift plate extending in a plane substantially perpendicular to the first direction and having an aperture for receiving the chuck during the reciprocating motion thereof;

first and second pairs of opposed centering jaws mounted to the shift plate for motion in a substantially rectilinear path toward and away from the aperture, the jaws of the first pair being movable toward and away from each other at opposite sides of the aperture along a line, the jaws of the second pair being movable toward and away from each other along a second line that intersects the first line, each of said jaws positioned to contact only the side faces of said part; and jaw operating means including first and second pairs of pivotally interconnected links lying in a plane adjacent and substantially parallel to said shift plate for moving said links, the links of each pair being pivotally connected to respective jaws of each pair.

13. A pick and place machine for positioning a part having a plurality of side faces, comprising:

a vacuum head that lifts and suspends said part; and first and second pairs of opposing centering jaws positioned substantially perpendicular to said vacuum head to contact only the side faces of said part, and movable linearly in a plane perpendicular to said vacuum head to adjust the position of said part on said vacuum head.

14. A method of automatically moving a part from a first location to a second location, comprising the steps of:

positioning a vacuum head proximate to a top surface of said part;

applying a vacuum to said vacuum head to lift and support said part;

adjusting the position of said part so that said part is positioned in a known position with respect to said vacuum head, comprising the steps of:

moving a first pair of centering jaws in a linear motion against a first pair of faces of said part so that said centering jaws contact only said first pair of faces, said first pair of jaws operating to center said part between said first pair of jaws; and moving a second pair of centering jaws in a linear motion against a second pair of faces of said part so that said centering jaws contact only said second pair of faces, said second pair of jaws operating to center said part between said pair of jaws, said part movable with respect to said first pair of jaws as said part is moved by said second pair of jaws;

moving said jaws to said second location; and releasing said part at said second location.

15. A pick and place machine for moving a part having a top surface and side faces, said machine comprising:

a head body;

means for mounting the head body to provide motion between a first position from which the part is to be taken and a second position to which the part is to be transferred;

a chuck mounted to the head body that provides reciprocating motion in a first direction toward and away from the part to be taken, the chuck having a tip that provides a vacuum for detachably supporting the part and securing the part to said tip; and a means for shifting the part secured to the tip, comprising:

a shift plate mounted to the head body, the shaft plate extending in a first plane substantially perpendicular to the first direction and having an aperture for receiving the chuck during the reciprocating motion thereof;

first and second pairs of opposed centering jaws slideably mounted to the shift plate for linear motion substantially parallel to the plane of the shift plate, toward and away from the aperture, between an open and closed position, the jaws of the first pair being movable toward and away from each other at opposite sides of the aperture along a first line, the jaws of the second pair being movable toward and away from each other along a second line intersecting said first line, each of said jaws positioned to contact only the side faces of said part;

jaw operating means for moving the jaws along said lines, said jaw operating means comprising first and second linkage means lying substantially in a second plane parallel to the first plane and respectively connected to jaws of the first and second pairs of opposed centering jaws; and said first pair of opposed centering jaws being slaved to move together along said first line of motion, and said second pair of opposed centering jaws being slaved to move together along said second line of motion, such that whenever both opposed jaws contact said part, said part is centered.

16. A pick and place machine for positioning a part, comprising:

a vacuum head that lifts and suspends said part;

a pair of opposed centering jaws, positioned substantially perpendicular to said vacuum head and the jaws of each pair slaved to be moved linearly together in a first line of motion, substantially perpendicular to said vacuum head, toward and away from said part, said slaved movement assuring that when both of said jaws contact said part, said part is centered on said vacuum head; and said pair of the jaws being positioned to contact only the side faces of said part.

* * * * *